United States Patent
Meaney et al.

(10) Patent No.: US 7,529,997 B2
(45) Date of Patent: May 5, 2009

(54) METHOD FOR SELF-CORRECTING CACHE USING LINE DELETE, DATA LOGGING, AND FUSE REPAIR CORRECTION

(75) Inventors: Patrick J. Meaney, Poughkeepsie, NY (US); William V. Huott, Holmes, NY (US); Thomas J. Knips, Wappingers Falls, NY (US); David J. Lund, Staatsburg, NY (US); Bryan L. Mechtly, Red Hook, NY (US); Pradip Patel, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 589 days.

(21) Appl. No.: 11/079,816

(22) Filed: Mar. 14, 2005

(65) Prior Publication Data

US 2006/0203578 A1 Sep. 14, 2006

(51) Int. Cl.
*G01R 31/28* (2006.01)
(52) U.S. Cl. .................. 714/733; 714/734; 714/726; 714/710; 365/200
(58) Field of Classification Search ................. 714/710, 714/726, 733, 734; 365/200
See application file for complete search history.

(56) References Cited

U.S. PATENT DOCUMENTS

2003/0226078 A1* 12/2003 Meaney et al. .............. 714/726

FOREIGN PATENT DOCUMENTS

CN 1380605 11/2002

\* cited by examiner

*Primary Examiner*—Guy J Lamarre
(74) *Attorney, Agent, or Firm*—Lynn L. Augspurger

(57) ABSTRACT

An apparatus and method for protecting a computer system from array reliability failures uses Array Built-In Self-Test logic along with code and hardware to delete cache lines or sets that are defective, identify corresponding fuse repair values, proactively call home if spare fuses are not available, schedule soft fuse repairs for the next system restart, schedule line deletes at the next restart, store delete and fuse repairs in a table (tagged with electronic serial id, timestamp of delete or ABIST fail event, address, and type of failure) and proactively call home if there were any missed deletes that were not logged. Fuse information can also be more permanently stored into hardware electronic fuses and/or EPROMs. During a restart, previous repairs are able to be applied to the machine so that ABIST will run successfully and previous deletes to be maintained with checking to allow some ABIST failures which are protected by the line deletes to pass.

1 Claim, 10 Drawing Sheets

Restart Repair Flow

Fuse Field Repairs Overview

FIGURE 2

SAMPLE CACHE LINE REPAIR TABLE

```
:beginFile
05/01/04__14:11
YH1016971432
:beginPU
1500 00 D00_FAF_A 00 00 --/--/--__--:-- D00_FAF_B 00 00 --/--/--__--:--
1500 00 D01_FAF_A 00 00 --/--/--__--:-- D01_FAF_B 00 00 --/--/--__--:--
1500 00 D02_FAF_A 00 00 --/--/--__--:-- D02_FAF_B 00 00 --/--/--__--:--
1500 00 D03_FAF_A 00 00 --/--/--__--:-- D03_FAF_B 00 00 --/--/--__--:--
.
.
:beginL2C
1700 00 BCBABT_FAR_A 00 00 --/--/--__--:-- BCBATP_FAR_B 00 00 --/--/--__--:--
1700 00 D0CDA0_FAR_A 00 00 --/--/--__--:-- D0CDA0_FAR_B FF 28 --/--/--__--:--
1700 00 D0CDA1_FAR_A 00 00 --/--/--__--:-- D0CDA1_FAR_B 00 00 --/--/--__--:--
1700 00 D0CDA2_FAR_A 00 00 --/--/--__--:-- D0CDA2_FAR_B 00 00 --/--/--__--:--
1700 00 D0CDA3_FAR_A 00 00 --/--/--__--:-- D0CDA3_FAR_B 00 00 --/--/--__--:--
.
:beginL2D
1800 00 DA0C0R1T_FAR 10 0F 05/01/04__16:42 DA0C0R2T_FAR 00 00 --/--/--__--:--
1800 00 DA0C0R1B_FAR 00 00 --/--/--__--:-- DA0C0R2B_FAR 00 00 --/--/--__--:--
1800 00 DA0C1R1T_FAR 00 00 --/--/--__--:-- DA0C1R2T_FAR 00 00 --/--/--__--:--
1800 00 DA0C1R1B_FAR 00 00 --/--/--__--:-- DA0C1R2B_FAR 00 00 --/--/--__--:--
1800 00 DA0C2R1T_FAR 00 00 --/--/--__--:-- DA0C2R2T_FAR 00 00 --/--/--__--:--
1800 00 DA0C2R1B_FAR 00 00 --/--/--__--:-- DA0C2R2B_FAR 00 00 --/--/--__--:--
1800 00 DA0C3R1T_FAR 00 00 --/--/--__--:-- DA0C3R2T_FAR 00 00 --/--/--__--:--
1800 00 DA0C3R1B_FAR 00 00 --/--/--__--:-- DA0C3R2B_FAR 00 00 --/--/--__--:--
1800 00 DA1C0R1T_FAR FF 2A --/--/--__--:-- DA1C0R2T_FAR FF 77 --/--/--__--:--
1800 00 DA1C0R1B_FAR 00 00 --/--/--__--:-- DA1C0R2B_FAR 00 00 --/--/--__--:--
.
1806 00 DA4C1R1B_FAR 00 00 --/--/--__--:-- DA4C1R2B_FAR 00 00 --/--/--__--:--
1806 00 DA4C2R1T_FAR 00 00 --/--/--__--:-- DA4C2R2T_FAR 00 00 --/--/--__--:--
1806 00 DA4C2R1B_FAR 00 00 --/--/--__--:-- DA4C2R2B_FAR 00 00 --/--/--__--:--
1806 00 DA4C3R1T_FAR FF 7C --/--/--__--:-- DA4C3R2T_FAR 30 36 05/01/04__14:23
1806 00 DA4C3R1B_FAR FF 64 --/--/--__--:-- DA4C3R2B_FAR 00 00 --/--/--__--:--
1806 00 DA5C0R1T_FAR FF 22 --/--/--__--:-- DA5C0R2T_FAR 00 00 --/--/--__--:--
1806 00 DA5C0R1B_FAR 00 00 --/--/--__--:-- DA5C0R2B_FAR 00 00 --/--/--__--:--
.
.
:end
```

FIGURE 5

Cache Line Delete Data Recording File

```
:beginFile

# id      type         deleted    setid    address    date         time
:beginPU
1500     ICACHE       0          0        0000       --/--/----   --:--:--.--
1500     IDIRECTORY   0          0        0000       --/--/----   --:--:--.--
1500     DCACHE       0          0        0000       --/--/----   --:--:--.--
1500     DDIRECTORY   0          0        0000       --/--/----   --:--:--.--
...
1519     ICACHE       0          0        0000       --/--/----   --:--:--.--
1519     IDIRECTORY   0          0        0000       --/--/----   --:--:--.--
1519     DCACHE       0          0        0000       --/--/----   --:--:--.--
1519     DDIRECTORY   0          0        0000       --/--/----   --:--:--.--
#Threshold flag   N = Threshold action not taken, Y = Threshold action taken
#       Threshold current count
#            Threshold expiration time in time_t format
#                      Threshold expiration time in formated date/time
# Number of L2 records
#       Pipe A delete count
#            Pipe B delete count
:beginL2
N   0001   990561041    05/22/2004 15:50:41
0006   0001   0001
# L2 Id
#    Pipe
#       Type            Interleave
#                            Syndrome
#                                  Compartment
#                                        Address    Date         Time
3700 A CACHE            84    004    02    0187    05/22/2004 15:21:56
3700 A CACHE            84    004    05    0187    05/22/2004 14:20:04
3700 A DIRECTORY        40    01C    05    0187    05/22/2004 14:22:49
3701 A CACHE            84    004    01    0187    05/22/2004 14:21:24
3701 A CACHE            84    004    05    0187    05/22/2004 14:44:59
3701 B CACHE            A4    004    03    0149    05/22/2004 14:46:14

:end
```

Restart Repair Flow

Restart Delete/Repair Flow

Soft Fuse Hardware

Electronic Fuse Hardware

EPROM Hardware

METHOD FOR SELF-CORRECTING CACHE USING LINE DELETE, DATA LOGGING, AND FUSE REPAIR CORRECTION

TRADEMARKS

IBM® is a registered trademark of International Business Machines Corporation, Armonk, N.Y., U.S.A. and other names used herein may be registered trademarks, trademarks or product names of International Business Machines Corporation or other companies.

BACKGROUND OF THE INVENTION

1. Field of the Invention

This invention relates to SMP computer systems having a cache design, and particularly to recovering the hardware after a failure.

2. Description of Background

As SMP computer systems continue to improve in performance, the cache designs are growing exponentially. These larger cache sizes are making it much more likely to have soft and hard array failures. Previously, a function called set delete was added to remove cache sections that have known defects. However, much of the prior art removes a lot of sets or compartments from the cache. The prior art used in the preferred embodiment allows for the deletion of one compartment within a congruence class without the full compartment delete.

Another aspect of the prior art of this invention allows for the purging of cache lines that have encountered an error. If the error is correctable, the data is re-corrected and enters the cache again as clean data, either in the original position or a different one. If the same set/compartment fails again (i.e. hard failure), a system log is made with all the failing data being logged out and that location is purged and deleted to avoid its use in the future. The preferred embodiment uses hardware to do this purge/delete. Logging is done through software code.

Even though these hardware features provide reliability benefits, the defective parts usually have to be replaced before a restart can be attempted. The reason is because the Array Built-In Self-Test (ABIST) checking logic will not usually pass when fuses have not been blown for a failing part of the array. The ABIST logic will make the failing address(es) available. Even when applying power-on repair, as described in U.S. Pat. No. 5,805,789, Huott, et al, there is a chance that there are no more fuses available for the repair and the part will need to be ordered before the customer can bring-up the machine again.

SUMMARY OF THE INVENTION

This invention is useful in SMP (symmetrical computer) systems having a cache design, and enables recovering the hardware. It is generally applicable to cache designs of various types, including, cache designs with fuses, fuse controls and line delete, and particularly to an apparatus and method for deleting lines upon repeated array failure, logging the failing address and cell information, determining and reserving fuse information for future restarts of the hardware, calling home when fuses are not available, running Array Built-in Self-Test (ABIST) upon a restart, and using the blown fuse information, reserved fuse information and newly identified ABIST failing information during restart to set soft fuses to allow the cache to operate, even after several reliability problems.

The invention also allows for saving line delete information at the next restart, running ABIST to test the arrays, and allowing the restart to occur if the only ABIST failures are protected by the line deletes.

The invention also provides for a way to permanently save the fuse results in a software table, programmable electronic fuses, and/or in EPROM hardware.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 illustrates high-level design of the components of the invention; while

FIG. 2 shows an example of a cache line repair table; while

FIG. 3 illustrates the L1 cache line delete flowchart; while

FIG. 4 illustrates the L2 cache line delete flowchart; while

FIG. 5 shows an example of a cache line delete table; while

FIG. 6 shows a restart repair flow; while

FIG. 7 shows a restart delete/repair flow; while

FIG. 8a shows the step of scanning programmable fuse information into latches; while FIG. 8b shows the step of burning repair information into an electronic fuse; while

Figure 1:
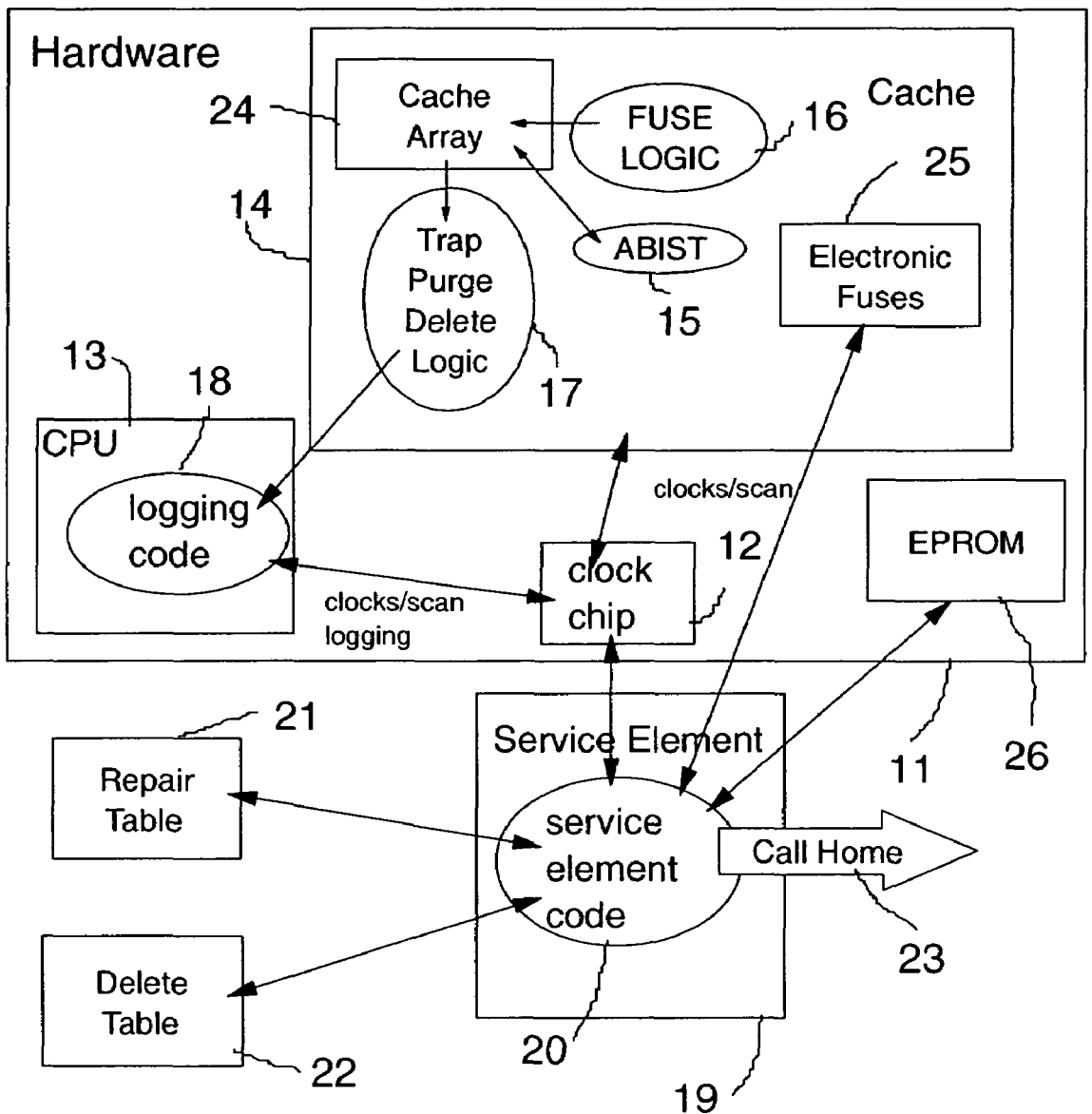

The detailed description explains the preferred embodiments of the invention, together with advantages and features, by way of example with reference to the drawings.

DETAILED DESCRIPTION OF THE INVENTION

In order to develop the detailed description of the invention the reader should keep in mind that our preferred embodiment allows for the self-managing of the cache fuse information to allow the cache to self-repair itself through code and hardware support.

In our preferred embodiment the 'blown' or 'hard' fuse data is read from the hardware into a table using code. This is usually done at initial startup of the machine. If the table already exists, there is no need to reread the entries into the table.

Logged failure data is used to determine which set of fuse values may be needed to relocate the failing array segments. These fuse values are reserved in a table. If there are no remaining fuses available for the relocate, the code may optionally notify the customer NOT to restart (i.e. IML) the machine and calls home for another part/module to replace the defective part. The reason for this is because a restart running ABIST will not have enough fuses to run and the ABIST logic will indicate failures for the unmapped failing segments that ran out of fuses.

The code may optionally preserve line delete information for use during the next IML, rather than converting them to repairs. After ABIST completes, any failures are compared to known line deletes to ensure that there are no failing regions in ABIST that are not also covered by line deletes.

The code also calls home if there were deletes that were missing in the logs because they were too close together in time to log them both. This is a very unlikely event, but the code allows for the protection of the customer so there is no risk of a surprise failure with no fuse during the next restart.

Another aspect occurs during the IML or restart sequence. The fuse table is loaded into the design via scanning, instead of relying strictly on the hard fuse settings. This allows for the relocation of failing segments that failed after the initial fuses were blown. This feature enables hardware with defects to be self-repaired in the field.

The preferred embodiment uses electronic fuses and these can be blown within the chip, in the field, to permanently save the new fuse information with the hardware, rather than in a separate table.

In an alternate embodiment fuse information is saved with separate hardware known as EPROMs (Erasable, Programmable Read-Only Memory).

A software version of the fuse table is provided with timestamps of when failures occurred, what event first detected the problem (e.g. ABIST, line delete, etc), and other useful information about the failure origins. This can be done in text for easier readability. The fuse repair table is tagged with a module serial number and is tracked against the module serial number using an electronic serial number within the module. If a new module is plugged, the table is recreated from the hard fuse information as needed.

There is also a delete table, with serial number tracking, that exists for line deletes. When a fuse is not available corresponding to a line delete, the fuse table is updated. The invention allows for the update of the deletes on the next restart to reapply deletes that were not repaired with fuses. Optionally, all deletes may be applied in lieu of soft or hard fuse repairs, provided code is used for analyzing ABIST failures to ensure that line deletes will avoid these defective regions.

These features and advantages should be reflected upon by the reader when reading a fuller description of the various Figures illustrating the preferred embodiment of the invention.

Turning now to FIG. 1, notice that there is Symmetrical Multi-processor SMP hardware, 11, consisting of a clock chip, 12, one or more CP chips, 13, and one or more cache chips, 14. Within each said cache chip, 14, there exists one or more cache arrays, 24, Array Built-In Self-Test (ABIST) logic, 15, fuse control logic, 16, and trap, purge, delete logic, 17. Within the said one or more CP chips, 13, there is logging code (e.g. CP microcode), 18, which can communicate failing array information from the said cache chips, 14, and a service element, 19, running service element code, 20, which reads and writes repair table, 21, and delete table, 22, and can make a call home action, 23. There is also optional electronic fuses, 25, which can be blown to save fuse information. There is also optional erasable programmable read-only memory (EPROM), 26, which can also be used to store fuse and repair information.

When an error occurs in a cache array, 24, trapping, purge, delete logic, 17, gathers information about the failure. If the failure is new, (i.e. the particular cache location was not encountered before) the cache entry is purged. If the failing array location has already failed at a previous time, the cache entry is purged and the hardware deletes the cache location so it never gets used again. Said logging code, 18, transfers this failure information through the clock chip, 12, to the service element, 19. Service element code, 20, upon reading the failing cache information, determines whether to call home, 23, or not, based on whether there were any missing deletes that were not logged. The code, 20, also determines which fuses would be needed for repairing the defects and compares these to the said repair table, 21. If there are not enough repairs left in the table for the given defect, the code, 20, calls home and informs the system operators not to restart the machine. When repairs are not found for the defect, the code, 20, will make an entry into the delete table, 22, for the delete. This delete can be reapplied to the hardware on the next restart. The code, 20, may also more permanently store the fuse information in the electronic fuses, 25, typically during the next IML window. This is usually accomplished by scanning desired fuse information into the scan ring (e.g. Soft fuse logic, 16) and applying a write voltage which updates the efuse information. The code, 20, may also store fuse information in a separate hardware storage area called the EPROM (Erasable, Programmable, Read-only Memory), 26 using conventional means.

It should be noted that the preferred embodiment of the cache array, 24, contains error correction logic which is used to detect a failing syndrome. The trap, purge, delete logic, 17, tracks the failing address, set or compartment, as well as the failing syndrome of the ECC used within the array. If a correctable error occurs, the syndrome can be used to detect the failing bit in the array, and, thus, the failing fuse location. However, when an uncorrectable error (UE) occurs, the isolation to the failing fuse may not be precise (i.e. there may be more than one possible fuse). Therefore, for UEs in the cache, the preferred embodiment will map a failure to four fuses, one for each area of the cache that the various bits may have originated from.

The repair table shown in FIG. 2, is an example of a repair table as used in the preferred embodiment. The said repair table, 21, consists of an ASCII, column-dependent, readable table organized by repair locations across the various chips and arrays, timestamps of repair, type of error which caused the repair, and whether the fuses were bad. It also contains the serial number of the hardware and the timestamp of when the file was first created.

Figure 3:
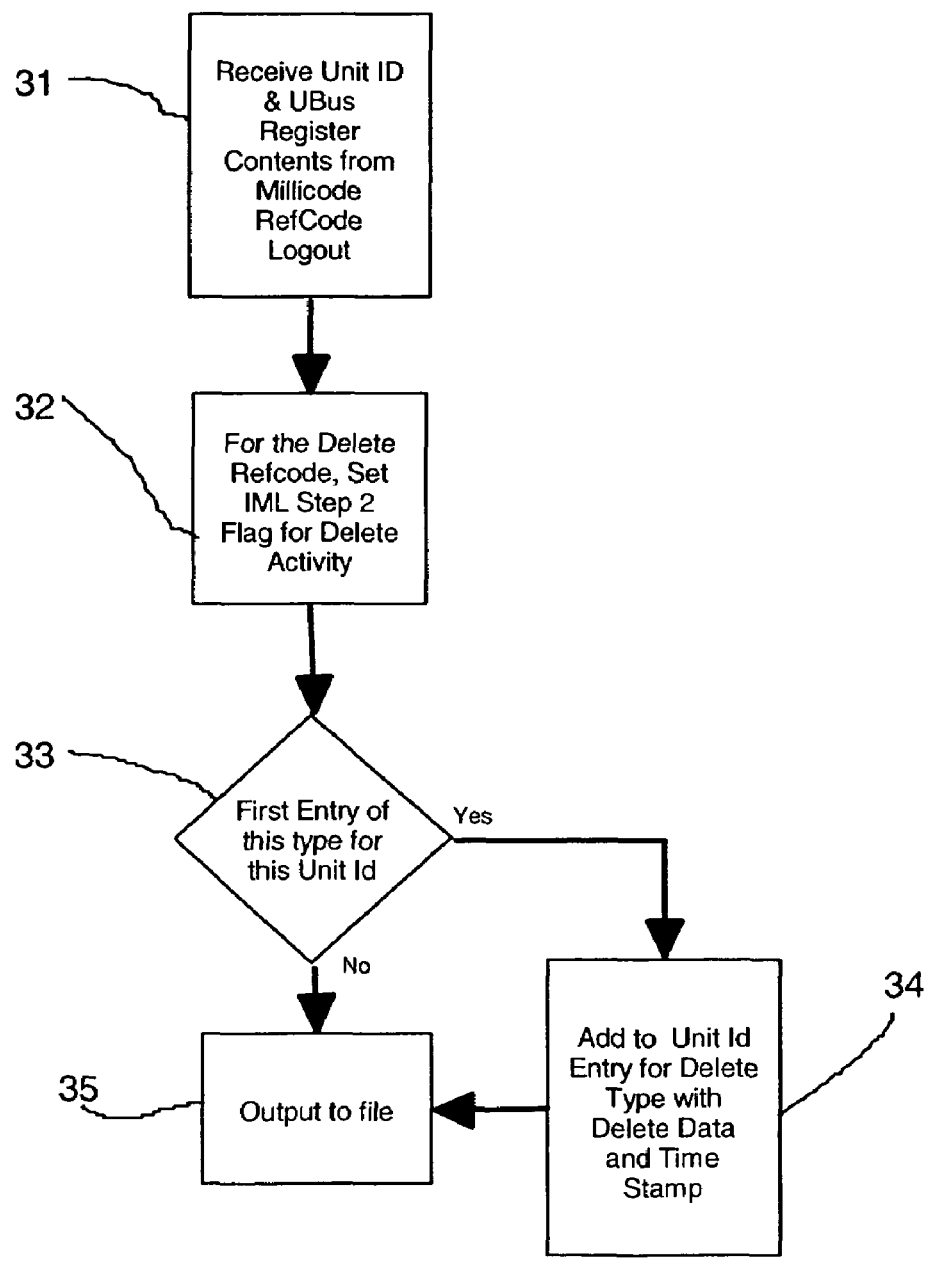

Turning to FIG. 3, notice that when processing L1 Cache failures, the code implements the steps of receiving information about the failure, 31, reserving the restart process of performing the delete, 32, and determining if this is the first delete of this type, 33. If this is a first delete of this type, unit id and other information is added to the delete table, 35. The results are written to the delete table, 35.

Figure 4:
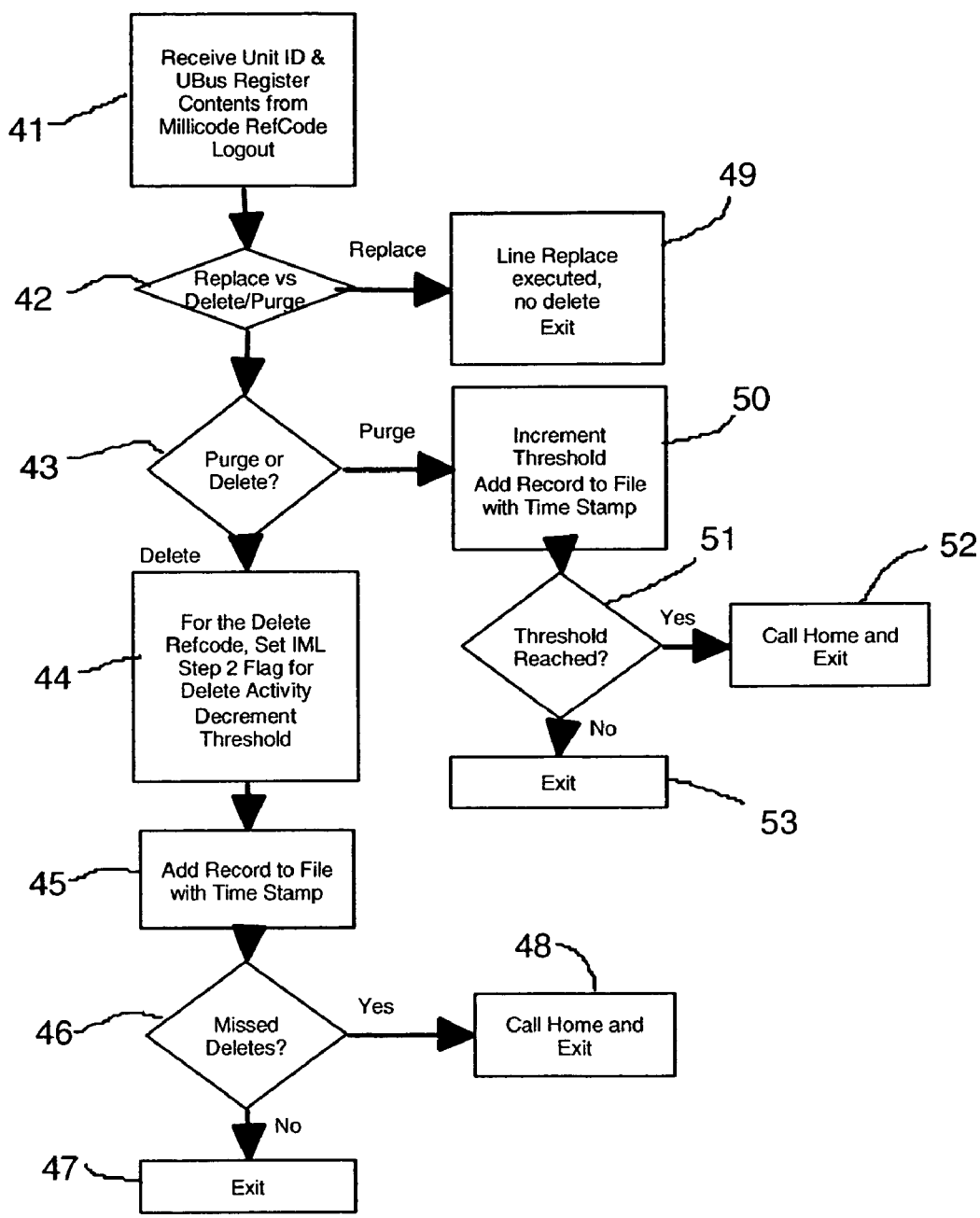

Turning to FIG. 4, notice that when processing L2 Cache failures, the code implements the steps of receiving information about the failure, 41, determining if it is a replace, 42, reserving the replace, 49, in the case of a replace.

If the event was not a replace, determining if it is a purge or delete, 43. If the event was a purge, performing the steps of incrementing the purge count, 50, determining if the purge count exceeded the threshold, 51, and calling home, 52, if it exceeded the threshold and exiting without error, 53, if the threshold was not reached.

If the event was a delete, performing the steps of reserving the restart process of performing the delete, 44, adding delete entry with timestamp, 45, to delete table, 22, checking for missed deletes, 46, and calling home, 48, if deletes were missing from the logged data and exiting without error, 47, if there were no missed deletes.

The delete table shown in FIG. 5, is an example of a delete table as used in the preferred embodiment. The said delete table, 22, consists of a PU section (for Cps) which is an ASCII, column-dependent, readable table organized by delete locations across the various L1 chips and arrays, timestamps of deletes and other delete information. In addition, there is an L2 section which is an ASCII, column-dependent, readable table organized by delete locations across the various L2 chips and arrays, timestamps of deletes, failing interleave, syndrome, compartment, and address as well as timestamps for the failures.

Figure 6:
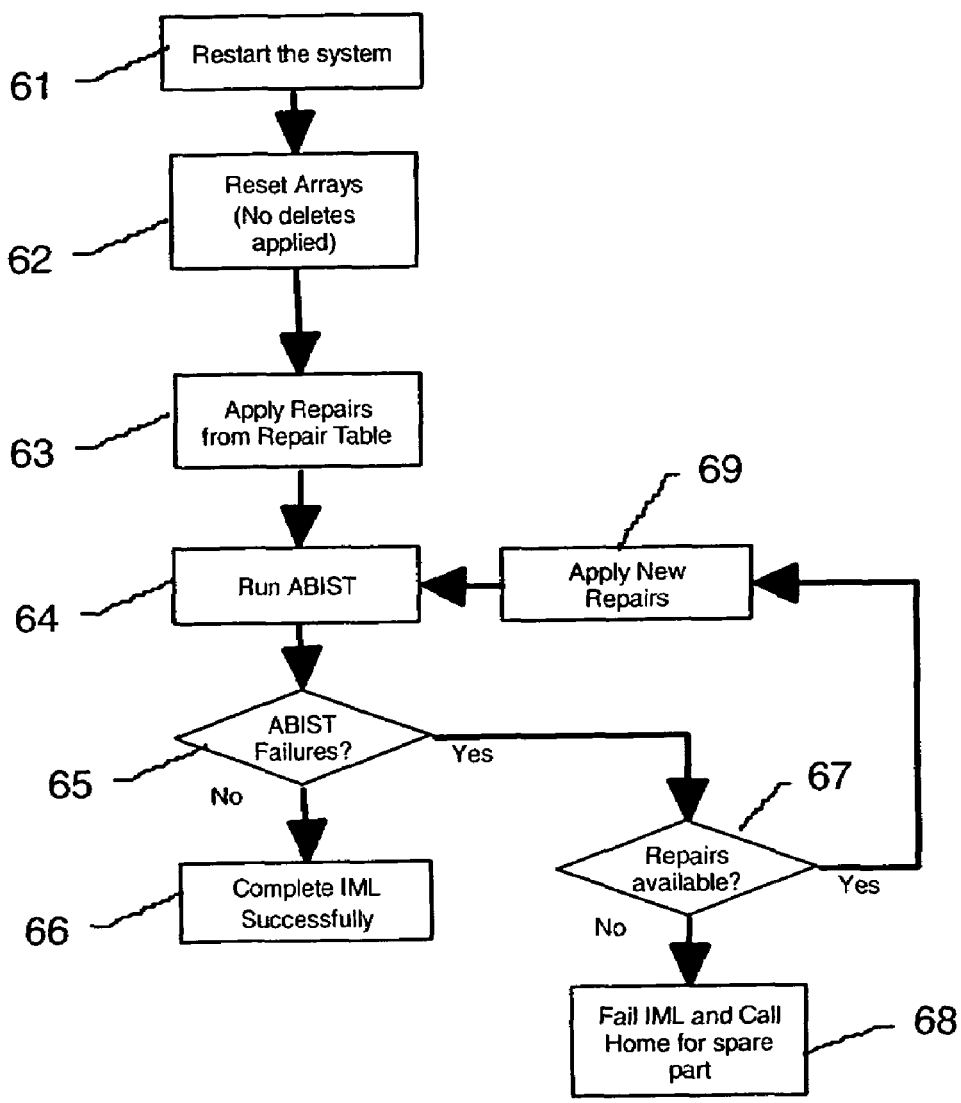

Turning to FIG. 6, notice the procedure for restarting a system with repairs. When the system is restarted, 61, the cache and other arrays are reset, 62. Then, array repairs are applied from the table, 63. ABIST is run, 64, testing the arrays. ABIST failures are analyzed, 65. If there are no failures, IML completes successfully, 66. However, if there are failures, available repairs are checked, 67. If there are no repairs available, IML fails and there is a call home for support, 68. If there are available fuses, the new fuse repairs are added to the repaired arrays, 69. ABIST is then run again, 64. After this, IML should be successful.

Figure 7:
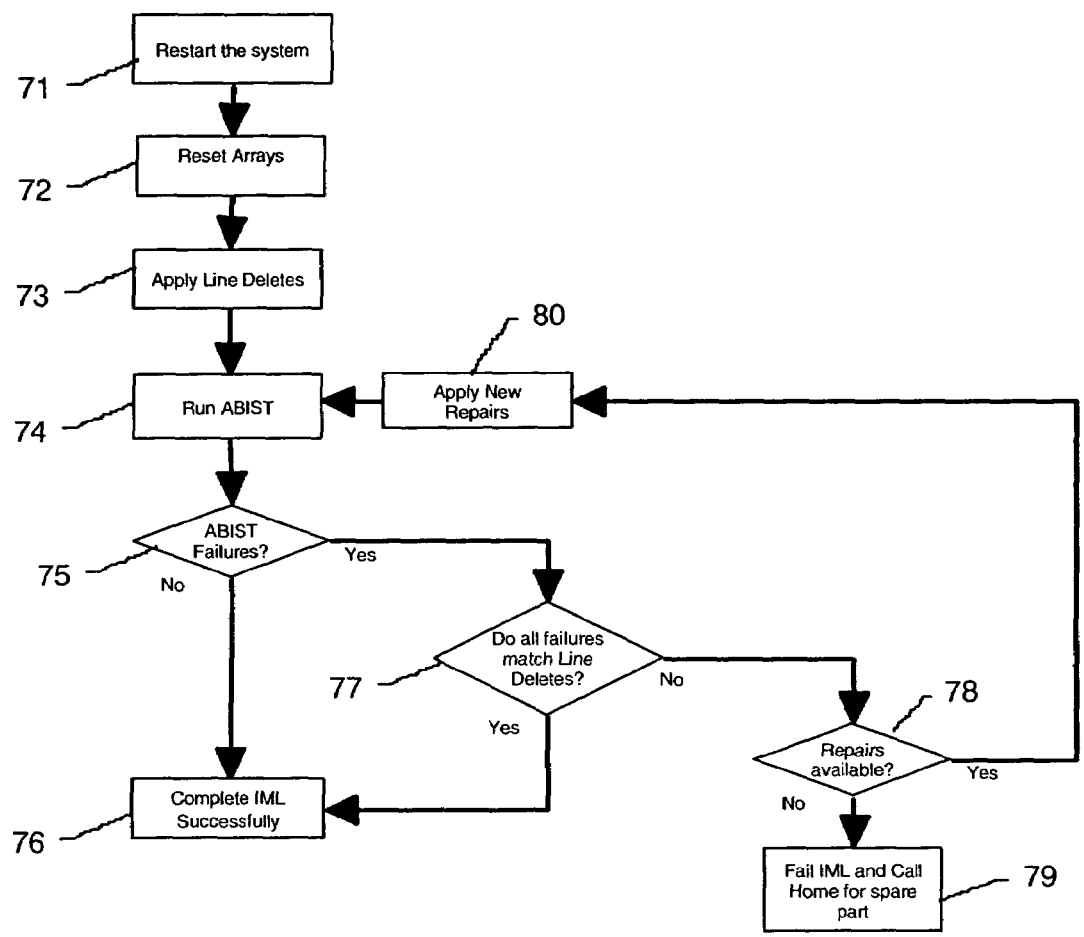

Turning to FIG. 7, notice the procedure for restarting a system with deletes and repairs. When the system is restarted, 71, the cache and other arrays are reset, 72. Then, array repairs and deletes are applied from the table, 73. ABIST is run, 74, testing the arrays. ABIST failures are analyzed, 75. If there are no failures, IML completes successfully, 76. However, if there are failures, each failure is compared to the list of line deletes, 77. Of course, this requires that ABIST results have enough information available to determine which lines would be affected. If all failures are determined to be protected by line deletes, IML completes successfully, 76. If there are any failures which are not covered by the line deletes, repairs are checked for availability, 78. If no corresponding repairs are available, the IML is failed and there will be a call home for parts, 79. If there are repairs available, new repairs are applied, 80, and ABIST is run again, 74. This time, there should be no remaining failures that are not covered by line deletes.

Figure 8A:
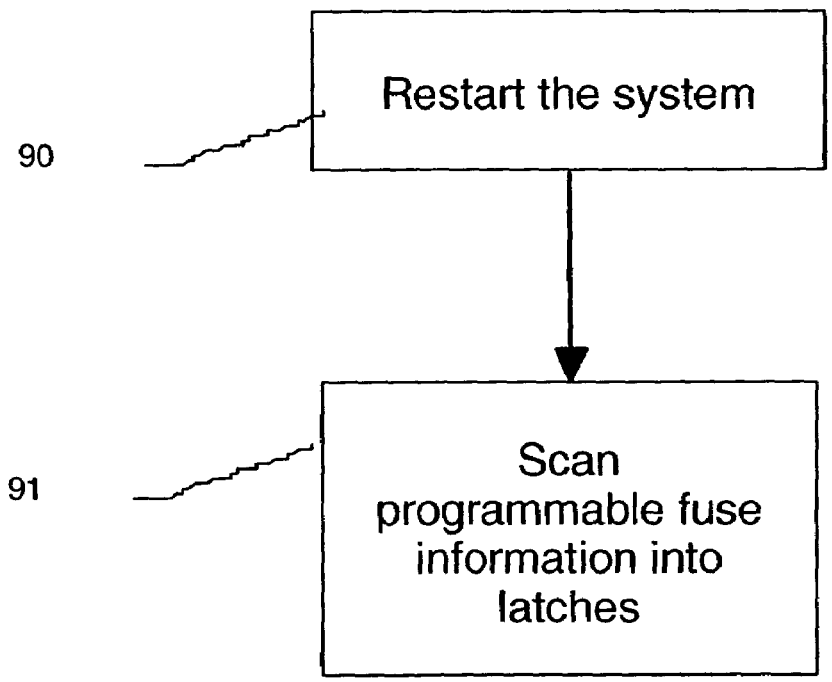

Turning to FIG. 8a, notice the procedure for restarting a system with soft register repairs. When the system is restarted, 90, there is a step to scan the fuse rings with the desired repair values, 91, thereby updating latches to hold the fuse values. These fuse repair values are held and supply the arrays with the needed redundancy programming to workaround bad parts of the arrays.

Figure 8B:
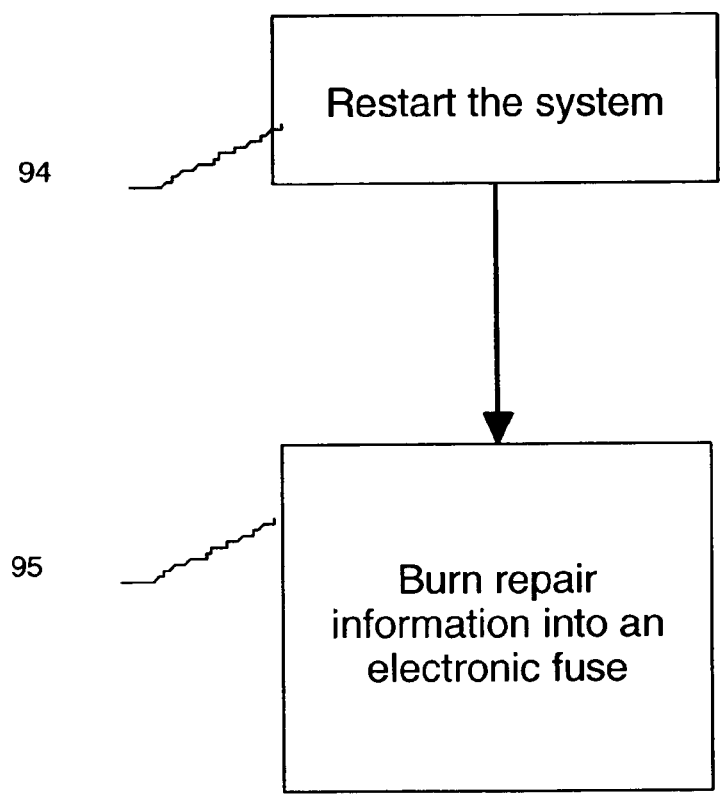

Turning to FIG. 8b, notice the procedure for restarting a system with electronic fuse repairs. When the system is restarted, 94, there is a step to burn electronic fuse information into electronic fuses with the desired repair values, 95, thereby establishing a permanent repair setting. There are various methods to burn electronic fuses. The preferred embodiment involves setting a higher 'burn' voltage that, when applied, can be used to permanently blow the electronic fuse. These fuse repair values are held and supply the arrays with the needed redundancy programming to workaround bad parts of the arrays. This electronic fuse repair information will remain in the hardware, even if power is dropped to the system.

Figure 8C:
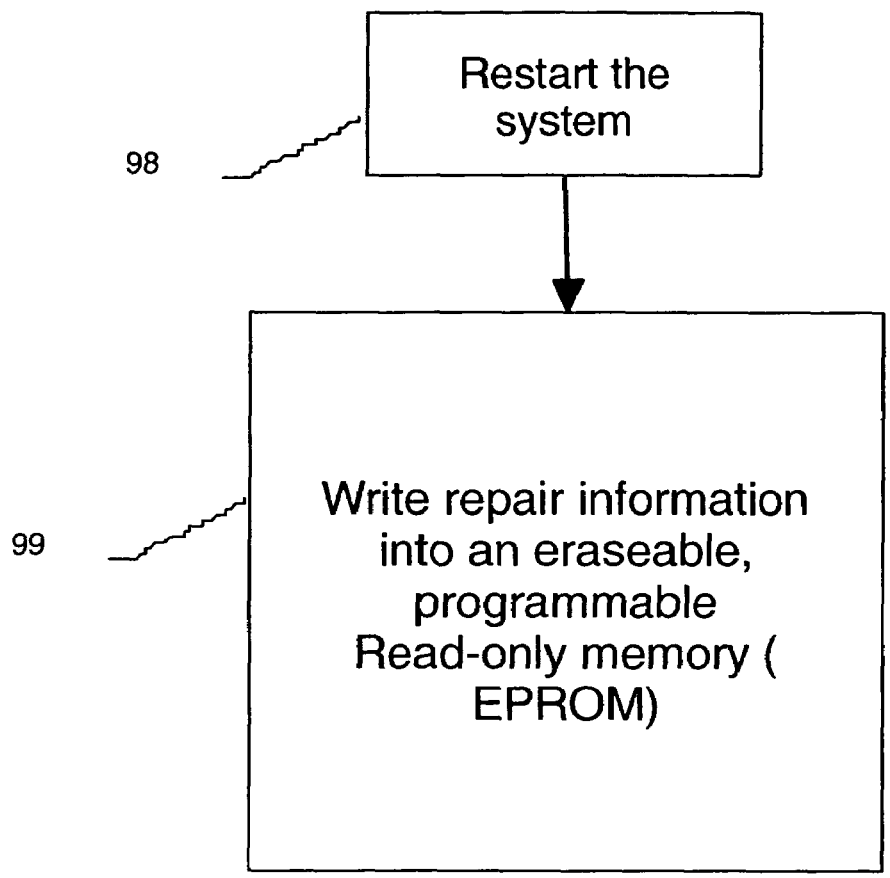
FIG. 8c shows the step of writing repair information into an erasable, programmable read-only memory (EPROM).

Turning to FIG. 8c, notice the procedure for restarting a system with erasable, programmable, read-only memory (EPROM) fuse repairs. When the system is restarted, 98, there is a step to write an EPROM with fuse repair information, 99, thereby establishing a permanent repair setting. These fuse repair values are held and can later be read out and scanned into the system soft fuse latches to supply the arrays with the needed redundancy programming to workaround bad parts of the arrays. This EPROM fuse repair information will remain in the hardware, even if power is dropped to the system. Typically, this information can be compressed into the EPROM.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. In an SMP computer system having a cache, the method of recovering the hardware comprising the steps of:
   a) performing a cache line delete to avoid using a defective cache line entry,
   b) reloading the cache line delete during a system restart, and then,
   c) during said system restart identifiying array built-in self-test (ABIST) failures by analyzing array built-in self-test (ABIST) results to determine if any identified array built-in self-test (ABIST) failures correspond to line delete entries, and
   d) allowing system restart to proceed if all of said any identified array built-in self-test (ABIST) failures correspond to said line delete entries.

* * * * *